United States Patent
Yamaguchi et al.

(10) Patent No.: US 10,797,141 B2
(45) Date of Patent: Oct. 6, 2020

(54) SEMICONDUCTOR DEVICE

(71) Applicant: Mitsubishi Electric Corporation, Tokyo (JP)

(72) Inventors: Yutaro Yamaguchi, Tokyo (JP); Masatake Hangai, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 76 days.

(21) Appl. No.: 16/319,158

(22) PCT Filed: Jul. 25, 2016

(86) PCT No.: PCT/JP2016/071721
§ 371 (c)(1),
(2) Date: Jan. 18, 2019

(87) PCT Pub. No.: WO2018/020549
PCT Pub. Date: Feb. 1, 2018

(65) Prior Publication Data
US 2020/0235215 A1    Jul. 23, 2020

(51) Int. Cl.
*H01L 29/423* (2006.01)
*H01L 23/482* (2006.01)
(Continued)

(52) U.S. Cl.
CPC .... *H01L 29/42316* (2013.01); *H01L 23/4821* (2013.01); *H01L 23/5286* (2013.01);
(Continued)

(58) Field of Classification Search
CPC .......... H01L 29/42316; H01L 23/5286; H01L 23/4821; H01L 29/7786; H01L 29/205; H01L 29/41758; H01L 29/2003
See application file for complete search history.

(56) References Cited

U.S. PATENT DOCUMENTS

2009/0108357 A1* 4/2009 Takagi ............... H01L 29/4238
                                                                    257/365
2010/0052014 A1    3/2010 Matsushita
(Continued)

FOREIGN PATENT DOCUMENTS

JP    2002-270822 A    9/2002
JP    2004-349467 A    12/2004
(Continued)

OTHER PUBLICATIONS

Darwish et al., "Thermal Resistance Calculation of AlGaN—GaN Devices," IEEE Transactions on Microwave Theory and Techniques, vol. 52, No. 11, Nov. 2004, pp. 2611-2620.
(Continued)

*Primary Examiner* — Karen Kusumakar
(74) *Attorney, Agent, or Firm* — Birch, Stewart, Kolasch & Birch, LLP

(57) ABSTRACT

A semiconductor device includes: an underlying substrate; a semiconductor layer formed on the underlying substrate; electrode patterns in which a drain electrode and a source electrode are alternately arranged along an array direction determined in advance, on the semiconductor layer; and a group of gate fingers each having a shape extending in an extending direction which is different from the array direction. Each of the gate fingers is disposed in a region between the drain electrode and the source electrode. Moreover, the gate fingers are arranged at positions displaced from one another in the extending direction.

18 Claims, 9 Drawing Sheets

(51) Int. Cl.
  *H01L 23/528* (2006.01)
  *H01L 29/778* (2006.01)
  *H01L 29/205* (2006.01)
  *H01L 29/417* (2006.01)
  *H01L 29/20* (2006.01)

(52) U.S. Cl.
  CPC ........ *H01L 29/2003* (2013.01); *H01L 29/205* (2013.01); *H01L 29/41758* (2013.01); *H01L 29/7786* (2013.01)

(56) References Cited

U.S. PATENT DOCUMENTS

| | | |
|---|---|---|
| 2010/0237437 A1 | 9/2010 | Takagi |
| 2010/0308872 A1 | 12/2010 | Gillberg |
| 2012/0119226 A1 | 5/2012 | Matsushita |
| 2014/0014969 A1 | 1/2014 | Kunil et al. |

FOREIGN PATENT DOCUMENTS

| | | |
|---|---|---|
| JP | 2008-141055 A | 8/2008 |
| JP | 2010-62320 A | 3/2010 |
| JP | 2010-62321 A | 3/2010 |
| WO | WO 2008/053748 A1 | 5/2008 |

OTHER PUBLICATIONS

International Search Report (PCT/ISA/210) issued in PCT/JP2016/071721, dated Oct. 11, 2016.
Notification of Reasons for Refusal issued in Japanese Patent Application No. 2016-572778, dated Feb. 28, 2017.
Office Action issued in corresponding European Application No. 16 910 453.6 dated Mar. 23, 2020.
Extended European Search Report issued in corresponding European Application No. 16910453.6 dated Jun. 26, 2019.

\* cited by examiner

SEMICONDUCTOR DEVICE

TECHNICAL FIELD

The present invention relates to a semiconductor device having a transistor structure.

BACKGROUND ART

In recent years, transistors containing nitride semiconductor such as gallium nitride (GaN) or aluminum gallium nitride (AlGaN) as component materials are widely used as power semiconductor devices for high frequencies such as the microwave. GaN is superior to other semiconductor materials such as gallium arsenide (GaAs) and silicon (Si) in terms of dielectric breakdown voltage and electron saturation velocity. For this reason, GaN is used as a component material for power semiconductor devices such as high-electron mobility transistors (HEMTs). For example, in the case of a power amplifier operating in a high frequency band, the power amplifier reaches a very high temperature state when operating in a region in which output power is saturated. At the very high temperature, there is the problem that the mobility of electrons decreases, which reduces the amount of current and output power. In order to suppress the decrease in the output power, it is important to thermally design the transistor structure of the power amplifier such that the high temperature is not reached.

On the other hand, in order to obtain high output power, a transistor structure called a multi-finger structure have been widely used in which transistor elements are arranged in parallel. For example, a HEMT which has a multi-finger structure disclosed in Non-Patent Literature 1 as listed below includes: GaN buffer layer formed on a substrate; an AlGaN barrier layer formed on the GaN buffer layer; a plurality of finger-shaped gate electrodes (hereinafter also referred to as "gate fingers") arranged along a predetermined direction on the AlGaN barrier layer; and drain electrodes and source electrodes which are formed at positions where each of the gate fingers is interposed therebetween.

CITATION LIST

Non-Patent Literature

Non-Patent Literature 1: Ali M. Darwish, A. Bayba, and H. A Hung, "Thermal Resistance Calculation of AlGaN/GaN Devices," IEEE Transactions on Microwave Theory and Techniques, vol. 52, issue 11, pp. 2611-2620, 2004.

SUMMARY OF INVENTION

Technical Problem

As described above, in order to suppress a decrease in the output power, it is important to thermally design a transistor structure such that the high temperature is not reached. In the case of the multi-finger structure described above, the thermal radiation characteristics can be improved by widening the intervals (pitches) between gate fingers. Specifically, because an end of each of the gate fingers on the drain electrode side is essentially a heat source, the widening of the intervals between the gate fingers enables overlapping of heat distributions generated at the respective gate fingers to be reduced. This allows the device temperature to be reduced.

However, the widening of the intervals between the gate fingers increases the size of the device. In addition, because the widening of the intervals between the gate fingers also increases the size of drain electrodes formed between the gate fingers, the parasitic capacitance due to the drain electrodes increases. Such an increase in the parasitic capacitance degrades the efficiency of the transistor.

In view of the foregoing, an object of the present invention is to provide a semiconductor device capable of improving thermal radiation characteristics while avoiding widening intervals between gate fingers as much as possible.

Solution to Problem

In accordance with one aspect of the present invention, there is a semiconductor device which includes: an underlying substrate having a first main surface and a second main surface which are opposed to each other; a semiconductor layer formed on the first main surface; electrode patterns in which a drain electrode and a source electrode are alternately arranged along at least one array direction determined in advance, on the semiconductor layer; and a group of gate fingers, each gate finger having a shape extending in an extending direction different from the at least one array direction on the semiconductor layer, and the each gate finger being disposed in a region between the drain electrode and the source electrode. The group of gate fingers includes a plurality of gate fingers which are arranged at respective positions displaced from one another in the extending direction.

Advantageous Effects of Invention

According to the present invention, it is possible to improve thermal radiation characteristics while avoiding widening intervals between gate fingers as much as possible.

DESCRIPTION OF EMBODIMENTS

Figure 1:
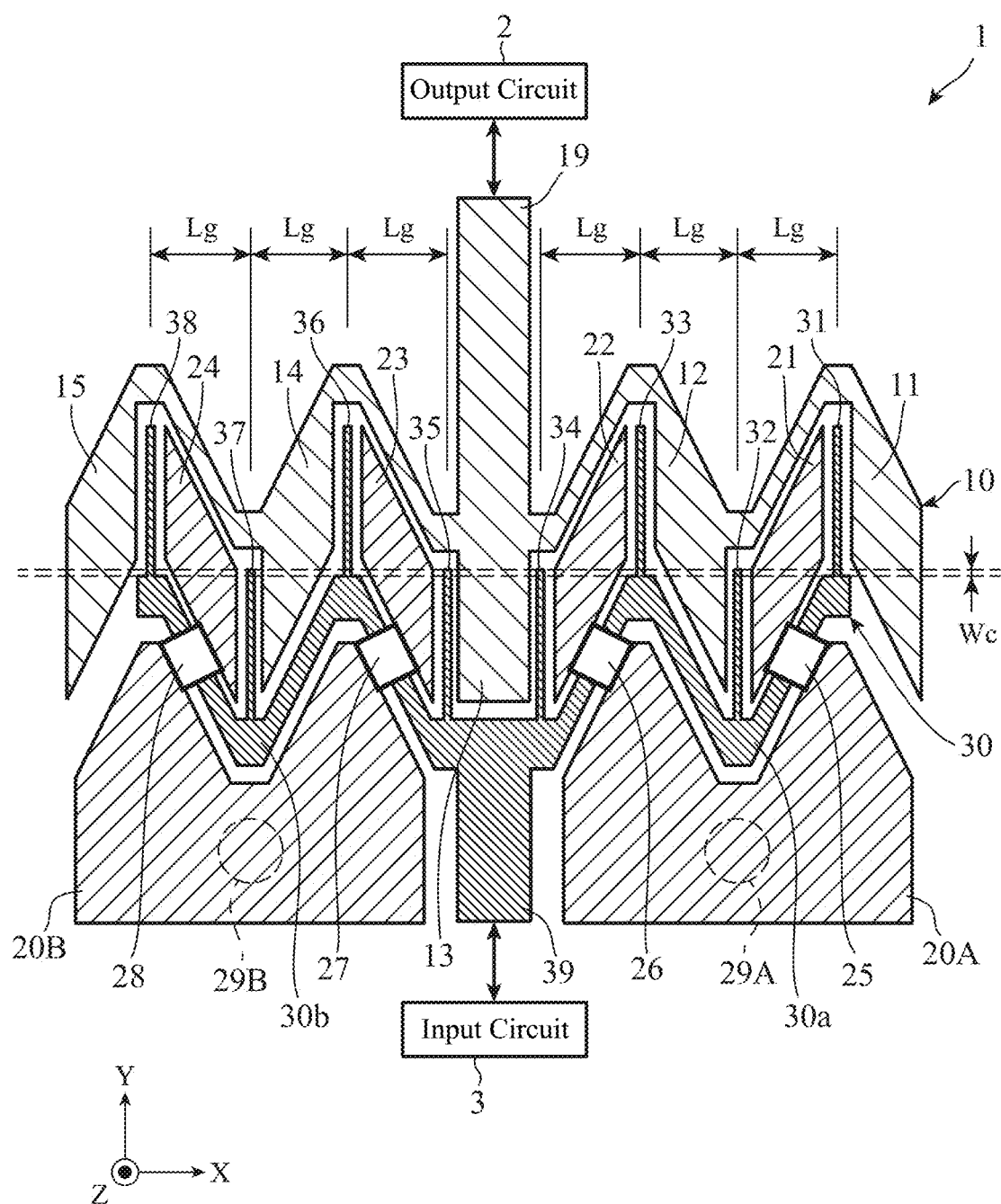
FIG. 1 is a plan view illustrating a layout of a semiconductor device having a multi-finger structure of a first embodiment according to the present invention.

Hereinafter, various embodiments according to the present invention will be described in detail with reference to the drawings. Note that components denoted by the same symbol throughout the drawings have the same structure and the same function. Moreover, the X-axis direction, the Y-axis direction, and the Z-axis direction as illustrated in the drawings are orthogonal to one another.

First Embodiment

Figure 2:
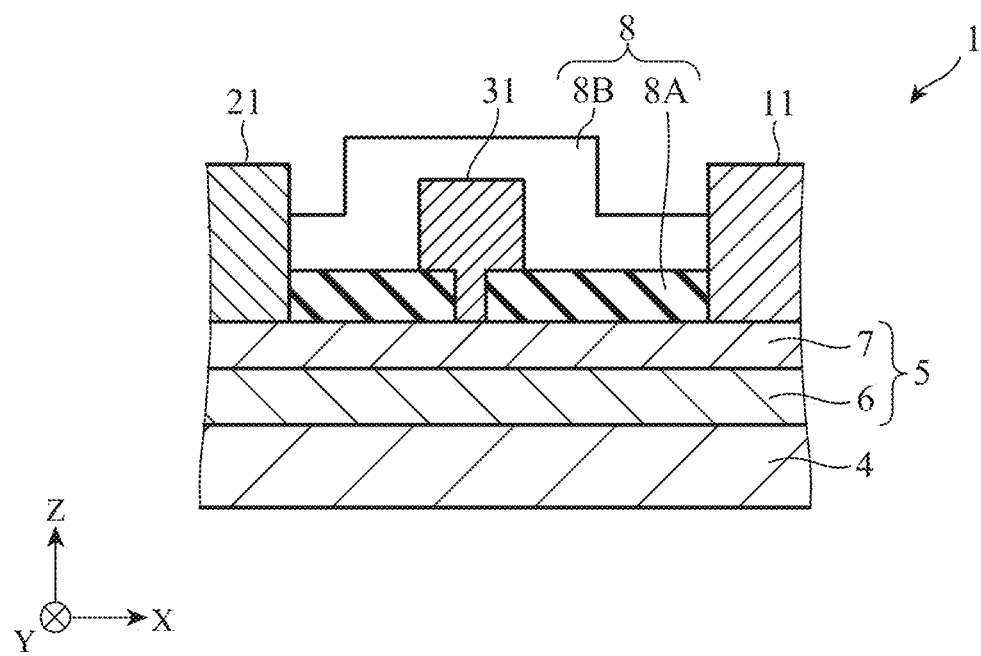
FIG. 2 is a schematic cross-sectional view of a unit transistor structure included as a part of the semiconductor device illustrated in FIG. 1.

FIG. 1 is a plan view illustrating a layout of a semiconductor device 1 having a multi-finger structure of a first embodiment according to the present invention. FIG. 2 is a schematic cross-sectional view of a unit transistor structure included as a part of the semiconductor device 1 illustrated in FIG. 1. In FIG. 2, a cross-section parallel to the X-Z plane including the X-axis and the Z-axis is illustrated.

As illustrated in FIG. 2, the semiconductor device 1 includes an underlying substrate 4 such as a silicon (Si) substrate, a silicon carbide (SiC) substrate, or a sapphire substrate and a multilayer stack 5 including a plurality of compound semiconductor layers stacked on a front surface (first main surface) of the underlying substrate 4. Moreover as illustrated in FIG. 1, the semiconductor device 1 includes: a conductive pattern 10 including drain electrodes 11 to 15; connecting conductors 20A and 20B for grounding; source electrodes 21 to 24; air bridges 25 and 26 which are interconnection layers for electrically connecting the source electrodes 21 and 22 to the connecting conductor 20A; air bridges 27 and 28 which are interconnection layers for electrically connecting the source electrodes 23 and 24 to the connecting conductor 20B; and a conductive pattern 30 including gate fingers 31 to 38. The conductive patterns 10 and 30, the source electrodes 21 to 24, the connecting conductors 20A and 20B, and the air bridges 25 to 28 are formed on the multilayer stack 5 illustrated in FIG. 2.

Note that the gate fingers 31 to 38 are covered with a protective film 8 including a lower protective film 8A and an upper protective film 8B as illustrated in FIG. 2. The protective film 8 is only required to be formed of an insulating film such as an aluminum oxide film ($Al_2O_3$ film) or a silicon nitride film (SiN film). For convenience of explanation, illustration of the protective film 8 is omitted in FIG. 1.

The semiconductor device of the present embodiment is a high frequency device having a high electron mobility transistor (HEMT) structure using group III nitride semiconductors. The group III nitride semiconductors are compound semiconductors containing both nitrogen (N) and a group III element such as gallium (Ga), indium (In), and/or aluminum (Al). For example, gallium nitride (GaN), aluminum nitride (AlN), indium nitride (InN), aluminum gallium nitride (AlGaN) or indium aluminum nitride (InAlN) may be used as group III nitride semiconductors.

The multilayer stack 5 illustrated in FIG. 2 includes a channel layer 6 formed on the underlying substrate 4 and a barrier layer 7 in heterojunction with the channel layer 6. A heterojunction interface is formed between the channel layer 6 and the barrier layer 7. With the existence of this heterojunction interface, two-dimensional electron gas is induced inside the channel layer 6. For example, a GaN layer can be formed as the channel layer 6, and as the barrier layer 7 for example an aluminum gallium nitride (AlGaN) layer or an indium nitride aluminum (InAlN) layer may be formed. The barrier layer 7 is not limited to a single layer, and may be configured as a plurality of layers such as an AlGaN layer and an InAlN layer. In addition, in order to control the heterojunction interface, a spacer layer such as AlN may be provided between the channel layer 6 and the barrier layer 7. The channel layer 6, the barrier layer 7, and the spacer layer can be formed by metal organic chemical vapor deposition (MOCVD) or molecular beam epitaxy (MBE).

Referring to FIG. 1, the conductive pattern 30 has a connection end 39 for signal input to be electrically connected to an input circuit 3 for transferring a high frequency signal, an interconnection portion 30a branching from the connection end 39 and extending in the X-axis positive direction, an interconnection portion 30b branching from the connection end 39 and extending in the X-axis negative direction, and a group of gate fingers 31 to 38 extending from the interconnection portions 30a and 30b in the Y-axis positive direction. In the present embodiment, the total number of the gate fingers 31 to 38 is eight, although no limitation to the total number is intended.

Each of the gate fingers 31 to 38 is a gate electrode having a linear finger shape extending in the Y-axis positive direction (an extending direction determined in advance). These gate fingers 31 to 38 have the same dimensions and are arranged at constant intervals (pitches) Lg in the X-axis direction (an array direction determined in advance). The conductive pattern 30 can be formed by, for example, a vapor deposition and dry etching using a metal material such as nickel (Ni) or gold (Au). Here, the interconnection portions 30a and 30b, the gate fingers 31 to 38, and the connection end 39 may be concurrently formed in the same deposition process, or may be separately formed in different deposition processes. At least the gate fingers 31 to 38 are formed so as to form a Schottky barrier junction with the barrier layer 7 in FIG. 2.

On the other hand, the conductive pattern 10 illustrated in FIG. 1 includes a connection end 19 for signal output to be electrically connected to an output circuit 2 for transferring a high frequency signal and the drain electrodes 11, 12, 13, 14, and 15 electrically connected to the connection end 19. The source electrodes 21, 22, 23, and 24 are further provided at positions corresponding to the drain electrodes 11, 12, 13, 14, and 15, respectively. As illustrated in FIG. 1, the drain electrodes 11 to 15 and the source electrodes 21 to 24 are arranged so as to form electrode patterns in which the source electrodes and the drain electrodes are alternately arranged along the X-axis direction. Each of the gate fingers 31 to 38 is arranged in each of the regions between the source electrodes and the drain electrodes alternately arranged. Therefore, in the present embodiment, eight unit transistor structures are formed.

The conductive pattern 10, the source electrodes 21 to 24, and the connecting conductors 20A and 20B can be formed by, for example, vapor deposition and dry etching using a metal material such as titanium (Ti) or aluminum (Al). Here, the conductive pattern 10, the source electrodes 21 to 24, and the connecting conductors 20A and 20B may be simultaneously formed in the same deposition process, or may be separately formed in different deposition processes. At least the source electrodes 21 to 24 and the drain electrodes 11 to 15 are formed so as to form an ohmic junction with the barrier layer 7 in FIG. 2.

Moreover as illustrated in FIG. 1, ends of the source electrodes 21 and 22 on the negative side of the Y-axis direction are electrically connected to the connecting conductor 20A by air bridges 25 and 26 made from a conductive material. Here, the air bridges 25 and 26 are formed as a bridge over the interconnection portion 30a of the conductive pattern 30 without contact with the interconnection portion 30a. Furthermore, the connecting conductor 20A is electrically connected to a via conductor 29A for grounding that passes through the multilayer stack 5 and underlying substrate 4 of FIG. 2 in the thickness direction of the underlying substrate 4 (Z-axis direction).

Meanwhile, ends of the source electrodes 23 and 24 on the negative side of the Y-axis direction are electrically connected to the connecting conductor 20B by air bridges 27 and 28 made from a conductive material. Here, the air bridges 27 and 28 are formed as a bridge over the interconnection portion 30b of the conductive pattern 30 without contact with the interconnection portion 30b. Furthermore, the connecting conductor 20B is electrically connected to a via conductor 29B for grounding that passes through the multilayer stack 5 and underlying substrate 4 in the thickness direction. the via conductors 29A and 29B described above are each connected to a grounding electrode (not illustrated) formed on the back surface (second main surface) of the underlying substrate 4 and are thereby grounded.

Next, the arrangement of the gate fingers 31 to 38, which is a feature of the present embodiment, will be described.

As illustrated in FIG. 1, the gate fingers 31 to 38 are classified into two groups of the gate fingers 31, 33, 36, and 38 arranged at an upper position and the gate fingers 32, 34, 35, and 37 arranged at a lower position. The gate fingers 31, 33, 36, and 38 at the upper position are arranged in a row along the X-axis direction, and the other gate fingers 32, 34, 35, and 37 at the lower position are also arranged in a row along the X-axis direction. Here, a plurality of the gate fingers 31, 33, 36, and 38 arranged at the upper position and a plurality of the gate fingers 32, 34, 35, and 37 arranged at the lower position are arranged at their respective positions which are displaced from each other in the Y-axis direction (that is, the extending direction of the gate fingers 31 to 38). Moreover, the gate fingers 31 to 38 of the present embodiment are arranged at their respective positions alternating between the upper and lower positions in the Y-axis direction. In other words, the gate fingers 31 to 38 are arranged such that the positions of the gate fingers adjacent to each other via a source electrode or drain electrode are displaced from each other in the Y-axis direction.

The drain electrodes 11 to 15 and the source electrodes 21 to 24 have substantially parallelogram shapes to match the arrangement of the gate fingers 31 to 38. In addition, the interconnection portions 30a and 30b have corrugated shapes which are curved shapes to match the arrangement of the gate fingers 31 to 38. An interconnection portion for connecting the drain electrodes 11 to 15 to the connection end 19 also has a corrugated shape as illustrated in FIG. 1. Furthermore, inner edges of the connecting conductors 20A and 20B also have corrugated shapes to match the shapes of the interconnection portions 30a and 30b.

When the gate fingers 31 to 38 are arranged in the above manner, the length $W_c$ of an overlapping region between a plurality of the gate fingers 31, 33, 36, and 38 arranged at the upper position and a plurality of the gate fingers 32, 34, 35, and 37 arranged at the lower position, as viewed from the X-axis direction, becomes small. This allows for reduction in the spatial overlap between heat distributions generated in the gate fingers 31 to 38. Therefore, as compared with the conventional multi-finger structure, the multi-finger structure of the present embodiment is capable of suppressing an increase in the thermal resistance.

Figure 3:
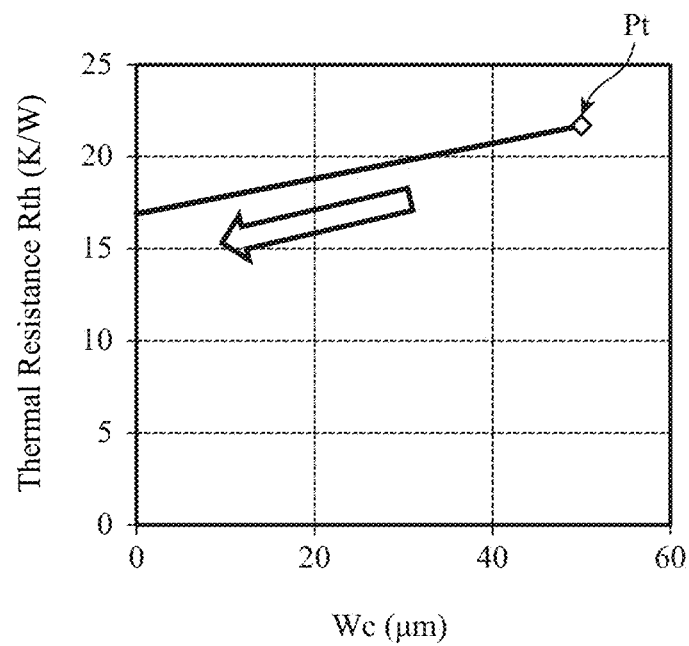
FIG. 3 is a graph illustrating a calculation result of thermal resistance obtained by a 45-degree method.

FIG. 3 is a graph illustrating a calculation result of thermal resistance obtained by a 45-degree method. The 45-degree method is a method for calculating one-dimensional thermal resistance on the condition that heat diffuses from a heat source of an end of each of the gate fingers toward the underlying substrate 4 at an angle of 45 degrees. The horizontal axis of the graph of FIG. 3 represents the length Wc (unit: micrometer) of an overlapping region, and the vertical axis of the graph represents the thermal resistance Rth (unit: K/W). The calculation conditions are shown as follows: the interval (Lg) of gate fingers is 20 μm; the number of gate fingers is eight; each gate width of gate fingers is 50 μm; the gate length of each of the gate fingers is 0.15 μm; and the underlying substrate 4 is a SiC substrate (thermal conductivity of SiC is 350 W/(m·K)). As illustrated in FIG. 3, it is understood that as the length Wc of an overlapping region becomes smaller, the thermal resistance Rth decreases. In particular, it is desirable to set Wc=0 μm to thereby allow the overlapping region to vanish entirely.

Figure 4:
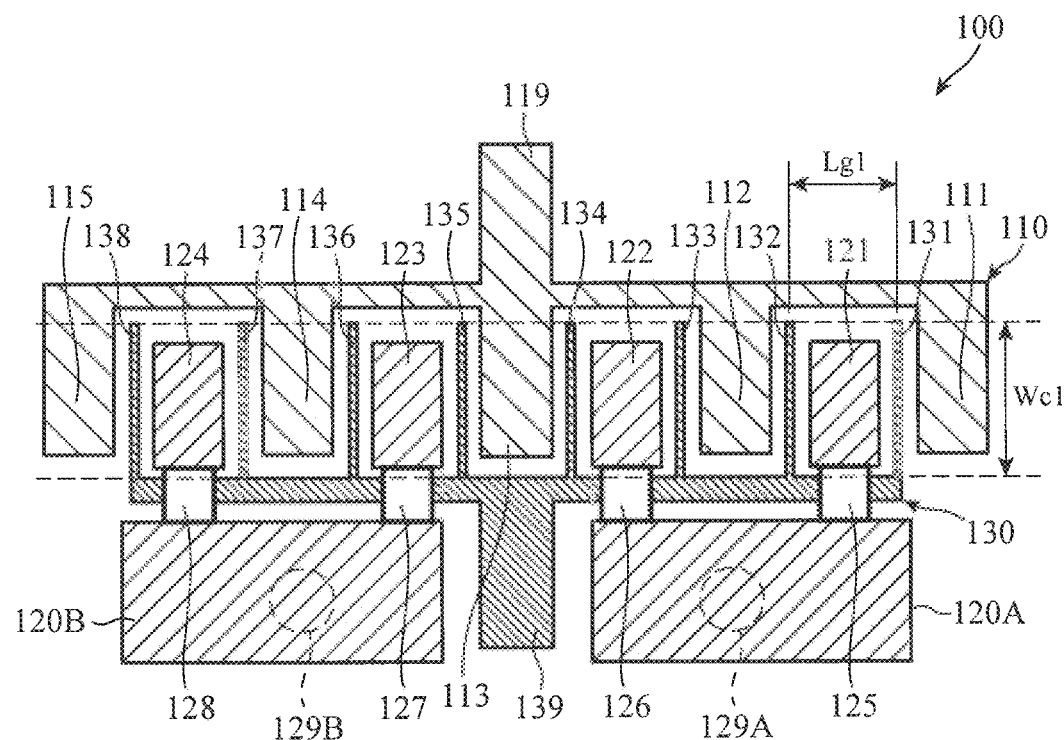
FIG. 4 is a plan view schematically illustrating an example of a layout of a semiconductor device having a conventional multi-finger structure.

Next, a conventional multi-finger structure will be described for comparison with the multi-finger structure of the present embodiment. FIG. 4 is a plan view schematically illustrating an example of a layout of a semiconductor device 100 having a conventional multi-finger structure. This semiconductor device 100 has a HEMT structure using GaN.

As illustrated in FIG. 4, the semiconductor device 100 includes: a conductive pattern 110 including drain electrodes 111 to 115 arranged in a row horizontally; connecting conductors 120A and 120B for grounding; source electrodes 121 to 124 arranged in a row horizontally; air bridges 125 and 126 which are interconnection layers for electrically connecting the source electrodes 121 and 122 to the connecting conductor 120A; air bridges 127 and 128 which are interconnection layers for electrically connecting the source electrodes 123 and 124 to the connecting conductor 120B; and a conductive pattern 130 including gate fingers 131 to 138 arranged in a row horizontally. The conductive pattern 110 also has a connection end 119 to be connected to an output circuit (not illustrated), and the conductive pattern 130 has a connection end 139 to be connected to an input circuit (not illustrated). Moreover, the gate fingers 131 to 138 are arranged at constant intervals Lg1 in the horizontal direction.

As illustrated in FIG. 4, the gate fingers 131 to 138 overlap with each other over the range of the length Wc1 when viewed from the array direction (horizontal direction) of the gate fingers. A point Pt illustrated in the graph of FIG. 3 corresponds to the length Wc1. Therefore, it is understood that in the multi-finger structure of the present embodiment the spatial overlap of heat distributions is mitigated as compared with the conventional multi-finger structure, thereby enabling reduction in the thermal resistance.

Figures 5A, 5B:
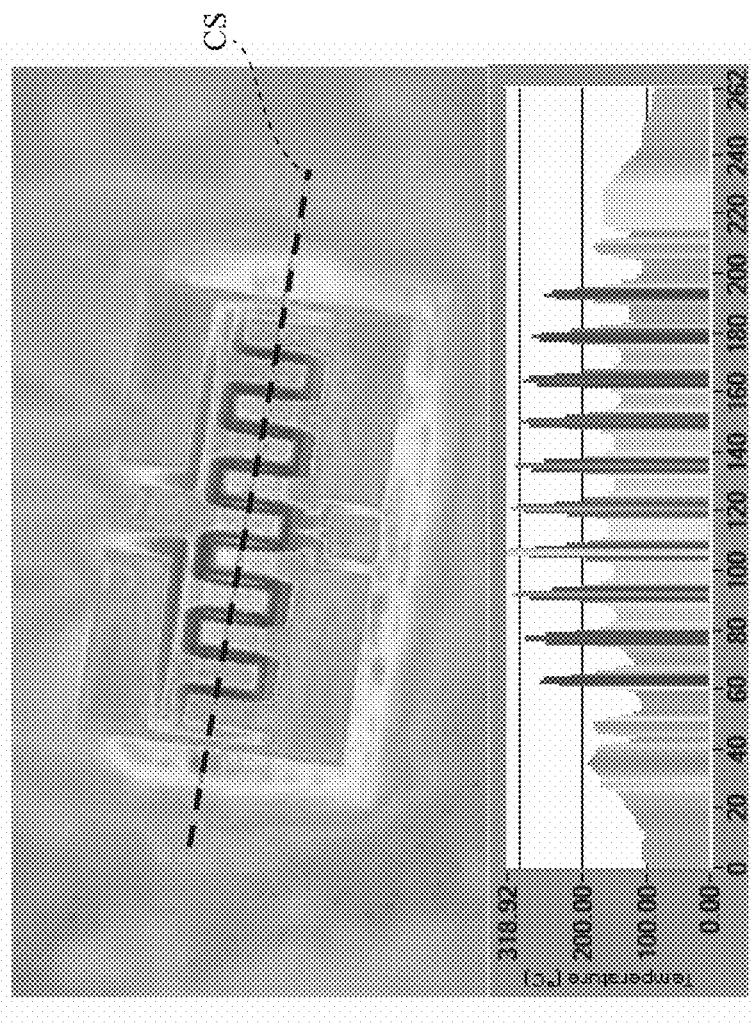
FIG. 5A is an example of a heat distribution photograph obtained by measuring a multi-finger structure of a HEMT in operation using an infrared (IR) microscope.
FIG. 5B is a graph illustrating a temperature distribution.

FIG. 5A is an example of a heat distribution photograph obtained by measuring a multi-finger structure of a conventional HEMT in operation using an infrared (IR) microscope. FIG. 5B is a graph illustrating a temperature distribution along a broken line CS in FIG. 5A. A horizontal axis of the graph of FIG. 5B represents the distance (unit: micrometer) from a reference position, and a vertical axis of the graph represents the device temperature (unit: ° C.). As illustrated in FIGS. 5A and 5B, it can be seen that a heat source is generated in each of the gate fingers. Furthermore, it can be seen that the overlap of heat distributions are occurring between the gate fingers since the temperature of gate fingers located in the center is higher than that of gate fingers positioned at the sides. In order to reduce the device temperature, it is necessary to minimize the spatial overlap of the heat distributions between the gate fingers.

As described above, the semiconductor device 1 of the present embodiment can improve thermal radiation characteristics while avoiding widening the intervals Lg between the gate fingers 31 to 38, as compared to the conventional multi-finger structure. This facilitates downsizing of the semiconductor device 1. In addition, because there is no need to increase the size of the drain electrodes 11 to 15 in the X-axis direction, there is the advantage that it is possible to improve the thermal radiation characteristics while avoiding increasing the parasitic capacitance occurring due to the drain electrodes 11 to 15.

The semiconductor device 1 of the present embodiment can be used in a power amplifier as an internal matching-field effect transistor (IM-FET) or as a part of a monolithic microwave integrated circuit (MMIC).

Second Embodiment

Figure 6:
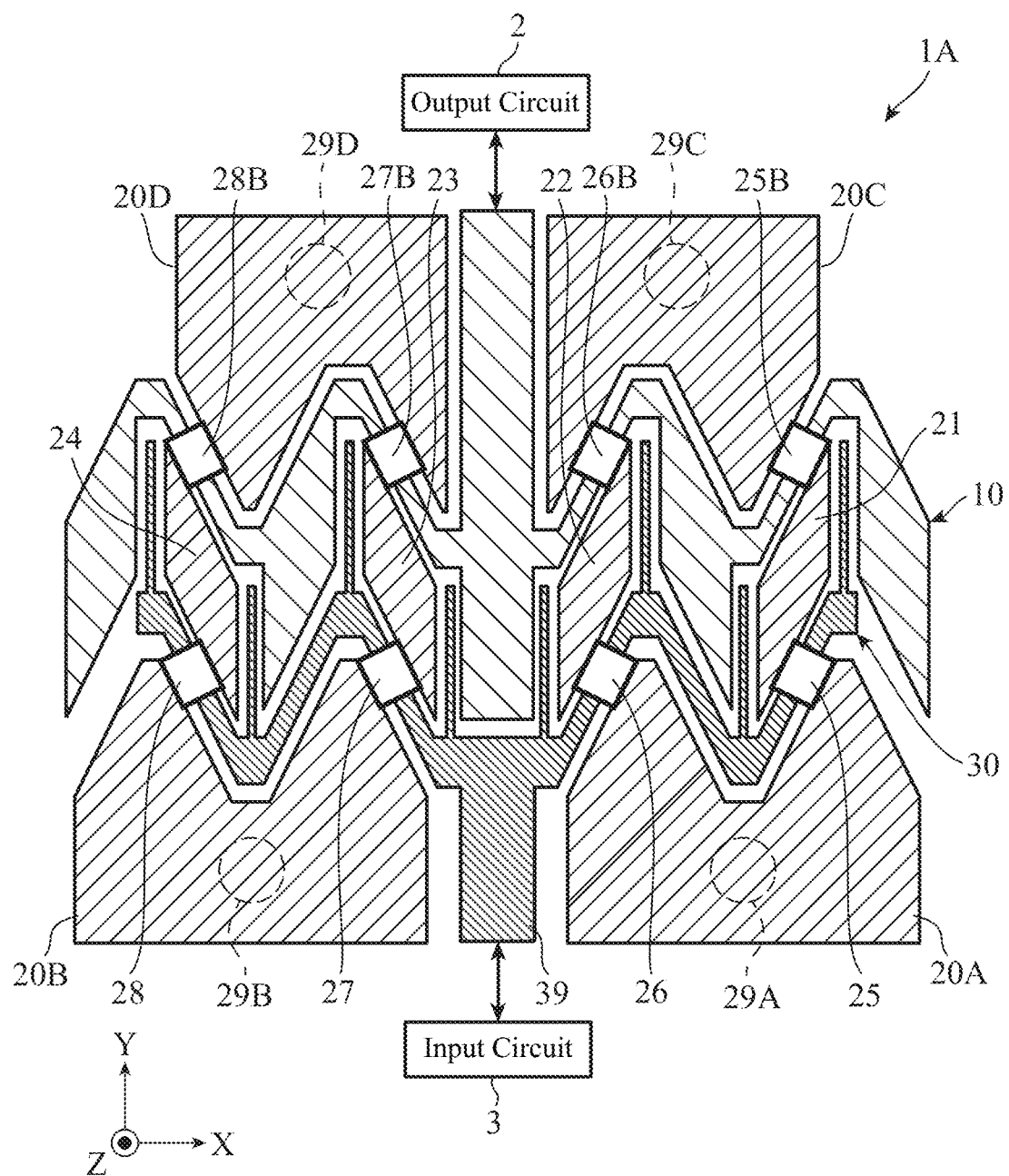
FIG. 6 is a plan view illustrating a layout of a semiconductor device having a multi-finger structure of a second embodiment according to the present invention.

Next, a second embodiment, which is a modification of the first embodiment, will be described. In the first embodiment, the number of the via conductors 29A and 29B for grounding is two, although no limitation thereto is intended. The structure of the first embodiment may be modified in a manner that allows the number of via conductors for grounding to be more than two. FIG. 6 is a plan view illustrating a layout of a semiconductor device 1A having a multi-finger structure of the second embodiment according to the present invention.

The semiconductor device 1A of the present embodiment includes a total of four via conductors 29A, 29B, 29C, and 29D for grounding. That is, the semiconductor device 1A has the same structure as that of the semiconductor device 1 of the first embodiment, and further includes connecting conductors 20C and 20D, air bridges 25B, 26B, 27B, and 28B and via conductors 29C and 29D as illustrated in FIG. 6.

As illustrated in FIG. 6, ends of source electrodes 21 and 22 on the positive side of the Y-axis direction are electrically connected to the connecting conductor 20C by the air bridges 25B and 26B made from a conductive material. Here, the air bridges 25B and 26B are formed as a bridge over the interconnection portion of a conductive pattern 10 without contact with the interconnection portion. Furthermore, the conductor 29C for grounding that passes through the multilayer stack 5 and underlying substrate 4 of FIG. 2 in the thickness direction of the underlying substrate 4.

Meanwhile, ends of the source electrodes 23 and 24 on the positive side of the Y-axis direction are electrically connected to the connecting conductor 20D by air bridges 27B and 28B made from a conductive material. Here, the air bridges 27B and 28B are formed as a bridge over an interconnection portion of the conductive pattern 10 without contact with the interconnection portion. Furthermore, the connecting conductor 20D is electrically connected to a via conductor 29D for grounding that passes through a multi-layer stack 5 and underlying substrate 4 in the thickness direction. The via conductors 29C and 29D described above are each connected to a grounding electrode (not illustrated) formed on the back surface (second main surface) of the underlying substrate 4 and are thereby grounded. Note that inner edges of the connecting conductors 20C and 20D have corrugated shapes corresponding to corrugated shapes of the interconnection portions of the conductive pattern 10.

As described above, the semiconductor device 1A according to the second embodiment has the same structure as that of the first embodiment and thus is capable of achieving similar effects to those of the first embodiment. Moreover, since in the present embodiment the number of the via conductors 29A to 29D for grounding is larger than that in the first embodiment, the source inductance is reduced, thereby improving the gain. Therefore, the semiconductor device 1A of the second embodiment has a structure more suitable for a high frequency band as compared with the first embodiment.

Third Embodiment

Figure 7:
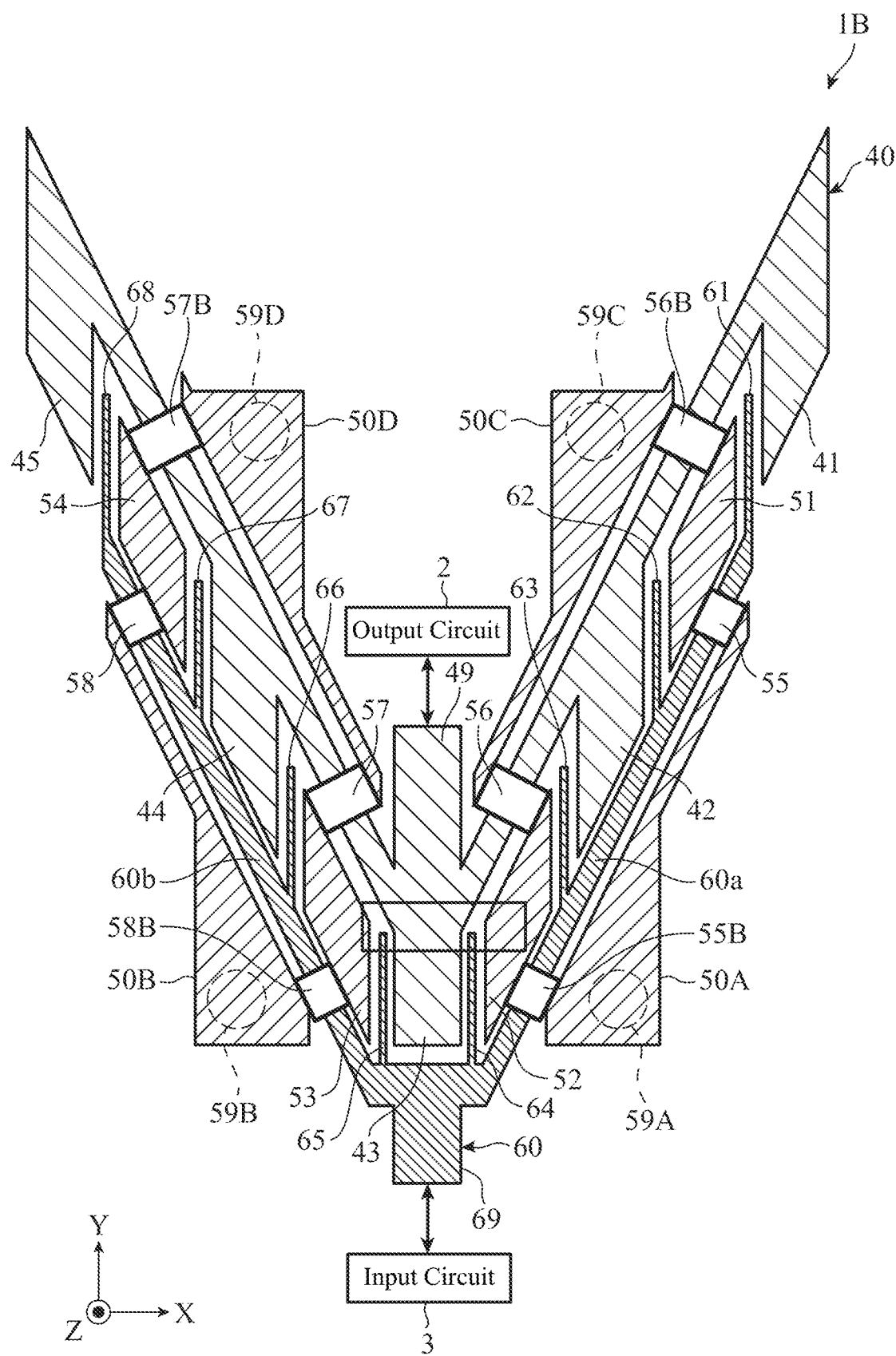
FIG. 7 is a plan view illustrating a layout of a semiconductor device having a multi-finger structure of a third embodiment according to the present invention.

Next, a third embodiment according to the present invention will be described. FIG. 7 is a plan view illustrating a layout of a semiconductor device 1B having a multi-finger structure of the third embodiment according to the present invention.

As illustrated in FIG. 7, the semiconductor device 1B includes: a conductive pattern 40 including drain electrodes 41 to 45; connecting conductors 50A, 50B, 50C, and 50D for grounding; source electrodes 51 to 54; air bridges 55, 56, 55B, and 56B which are interconnection layers for electrically connecting the source electrodes 51 and 52 to the connecting conductors 50A and 50C; air bridges 57, 58, 57B, and 58B which are interconnection layers for electrically connecting the source electrodes 53 and 54 to the connecting conductors 50B and 50D; and a conductive pattern 60 including gate fingers 61 to 68.

The conductive patterns 40 and 60, the source electrodes 51 to 54, the connecting conductors 50A, 50B, 50C, and 50D, and the air bridges 55, 56, 55B, 56B, 57, 58, 57B, and 58B are formed on the multilayer stack 5 illustrated in FIG. 2 like in the first embodiment.

The conductive pattern 60 has a connection end 69 for signal input to be electrically connected to an input circuit 3 for transferring a high frequency signal, an inclined interconnection portion 60a branching from the connection end 69 and extending in an oblique direction inclined at an angle less than 90 degrees in a clockwise direction with respect to the Y-axis positive direction, an inclined interconnection portion 60b branching from the connection end 69 and extending in an oblique direction inclined at an angle less than 90 degrees in a counterclockwise direction with respect to the Y-axis positive direction, and a group of gate fingers 61 to 68 extending from the inclined interconnection portions 60a and 60b in the Y-axis positive direction. Note that in the present embodiment the total number of the gate fingers 61 to 68 is eight, although no limitation to the total number is intended.

Each of the gate fingers 61 to 68 is a gate electrode having a linear finger shape extending in the Y-axis direction (an extending direction determined in advance). These gate fingers 61 to 68 have the same dimensions and are arranged at constant intervals (pitches) in the X-axis direction. The conductive pattern 60 can be formed by, for example, vapor deposition and dry etching using a metal material such as Ni or Au. Here, the interconnection portions 60a and 60b, the gate fingers 61 to 68, and the connection end 69 may be simultaneously formed in the same deposition process, or may be separately formed in different deposition processes. At least the gate fingers 61 to 68 are formed so as to form a Schottky barrier junction with the barrier layer 7 in FIG. 2.

On the other hand, the conductive pattern 40 illustrated in FIG. 7 includes a connection end 49 for signal output to be electrically connected to an output circuit 2 for transferring a high frequency signal and the drain electrodes 41, 42, 43, 44, and 45 electrically connected to the connection end 49 via an interconnection portion. The source electrodes 51, 52, 53, 54, and 55 are further provided at positions corresponding to the drain electrodes 41, 42, 43, 44, and 45, respectively. As illustrated in FIG. 7, the drain electrodes 41 to 45 and the source electrodes 51 to 55 are arranged so as to form electrode patterns in which the source electrodes and the drain electrodes are alternately arranged along an array direction determined in advance. Each of the eight gate fingers 61 to 68 is arranged in each of the regions between the source electrodes and the drain electrodes alternately arranged. Therefore, in the present embodiment, eight unit transistor structures are formed.

The conductive pattern 40, the source electrodes 51 to 54, and the connecting conductors 50A, 50B, 50C, and 50D can be formed by, for example, vapor deposition and dry etching using a metal material such as Ti or Al. Here, the conductive pattern 40, the source electrodes 51 to 54, and the connecting conductors 50A, 50B, 50C, and 50D may be simultaneously formed in the same deposition process, or may be separately formed in different deposition processes. At least the source electrodes 51 to 54 and the drain electrodes 41 to 45 are formed so as to form an ohmic junction with the barrier layer 7 in FIG. 2.

Furthermore as illustrated in FIG. 7, an end of the source electrode 51 on the negative side of the Y-axis direction is electrically connected to the connecting conductor 50A by an air bridge 55 made from a conductive material. An end of the source electrode 52 on the negative side of the Y-axis direction is also electrically connected to the connecting conductor 50A by an air bridge 55B made from a conductive material. Here, the air bridges 55 and 55B are formed as a bridge over the interconnection portion 60a of the conductive pattern 60 without contact with the interconnection portion 60a. Furthermore, the connecting conductor 50A is electrically connected to a via conductor 59A for grounding that passes through the multilayer stack 5 and underlying substrate 4 of FIG. 2 in the thickness direction of the underlying substrate 4 (Z-axis direction).

Furthermore, ends of the source electrodes 51 and 52 on the positive side of the Y-axis direction are electrically connected to the connecting conductor 50C by air bridges 56 and 56B made from a conductive material. Here, the air bridges 56 and 56B are formed as a bridge over an interconnection portion of the conductive pattern 40 without contact with the interconnection portion. Furthermore, the connecting conductor 50C is electrically connected to a via conductor 59C for grounding that passes through the multilayer stack 5 and underlying substrate 4 of FIG. 2 in the thickness direction of the underlying substrate 4.

Meanwhile, an end of the source electrode 54 on the negative side of the Y-axis direction is electrically connected to the connecting conductor 50B by an air bridge 58 made from a conductive material. An end of the source electrode 53 on the negative side of the Y-axis direction is also electrically connected to the connecting conductor 50A by an air bridge 58B made from a conductive material. Here, the air bridges 58 and 58B are formed as a bridge over the interconnection portion 60b of the conductive pattern 60 without contact with the interconnection portion 60b. Furthermore, the connecting conductor 50B is electrically connected to a via conductor 59B for grounding that passes through the multilayer stack 5 and underlying substrate 4 of FIG. 2 in the thickness direction of the underlying substrate 4.

Furthermore, ends of the source electrodes 53 and 54 on the positive side of the Y-axis direction are electrically connected to the connecting conductor 50D by air bridges 57 and 57B made from a conductive material. Here, the air bridges 57 and 57B are formed as a bridge over an interconnection portion of the conductive pattern 40 without contact with the interconnection portion. Furthermore, the connecting conductor 50D is electrically connected to a via conductor 59D for grounding that passes through the multilayer stack 5 and underlying substrate 4 of FIG. 2 in the thickness direction of the underlying substrate 4.

Next, an arrangement of the gate fingers 61 to 68 of the present embodiment will be described. As illustrated in FIG. 7, the gate fingers 61 to 64 extend from the inclined interconnection portion 60a in the Y-axis positive direction. The gate fingers 61 to 64 are arranged at constant intervals along an oblique direction (first array direction) inclined at an angle less than 90 degrees in a clockwise direction with respect to the Y-axis positive direction. Moreover, the gate fingers 61 to 64 are arranged at respective positions displaced from one another in the Y-axis direction. The gate fingers 65 to 68 extend from the other inclined interconnection portion 60b in the Y-axis positive direction. The gate fingers 65 to 68 are arranged at constant intervals along an oblique direction (second array direction) inclined at an angle less than 90 degrees in a counterclockwise direction with respect to the Y-axis positive direction. Moreover, the gate fingers 65 to 68 are arranged at respective positions displaced from one another in the Y-axis direction. Therefore, the gate fingers 61 to 68 are arranged to be V-shaped as a whole. The drain electrodes 41 to 45 and the source electrodes 51 to 54 have substantially parallelogram shapes to match the arrangement of the gate fingers 61 to 68.

When the gate fingers 61 to 68 are arranged in such a manner, it is possible to allow overlapping regions, as viewed from the X-axis direction, between the gate fingers 61 to 64 extending from the inclined interconnection portion 60a to substantially vanish (in particular, regarding an overlapping region between adjacent gate fingers via a source electrode or drain electrode). Likewise, it is also possible to allow overlapping regions, as viewed from the X-axis direction, between the gate fingers 65 to 68 extending from the other inclined interconnection portion 60b to substantially vanish (in particular, regarding an overlapping region between adjacent gate fingers via a source electrode or drain electrode). This allows for reduction in the spatial overlap between heat distributions generated in the gate fingers 61 to 68. Therefore, as compared with the conventional multi-finger structure, the multi-finger structure of the present embodiment is capable of suppressing an increase in the thermal resistance.

As described above, the semiconductor device 1B of the third embodiment can improve thermal radiation characteristics while avoiding widening the intervals between the gate fingers 61 to 68 in the X-axis direction, as compared to the conventional multi-finger structure. This facilitates downsizing of the semiconductor device 1B. In addition, because there is no need to increase the size of the drain electrodes 41 to 45 in the X-axis direction, there is the advantage that it is possible to improve the thermal radiation characteristics while avoiding increasing the parasitic capacitance occurring due to the drain electrodes 11 to 15.

In addition, the semiconductor device 1B of the third embodiment can also be used in a power amplifier as an IM-FET or as a part of an MMIC. In particular, when the semiconductor device 1B is used as a part of the MMIC, the output circuit 2 can be arranged in a region between the inclined interconnection portions 60a and 60b (region in the V-shaped valley) as illustrated in FIG. 7, and thus it is possible to easily downsize the entire power amplifier.

Fourth Embodiment

Next, a fourth embodiment according to the present invention will be described. In the first to third embodiments, each of the source electrodes is connected to the connecting conductor for grounding using an air bridge. In contrast, in the fourth and fifth embodiments described below, a via conductor for grounding (island source via (ISV)) is connected to a back surface of each source electrode. In the fourth and fifth embodiments, therefore, no connecting conductor for grounding is necessary.

Figure 8:
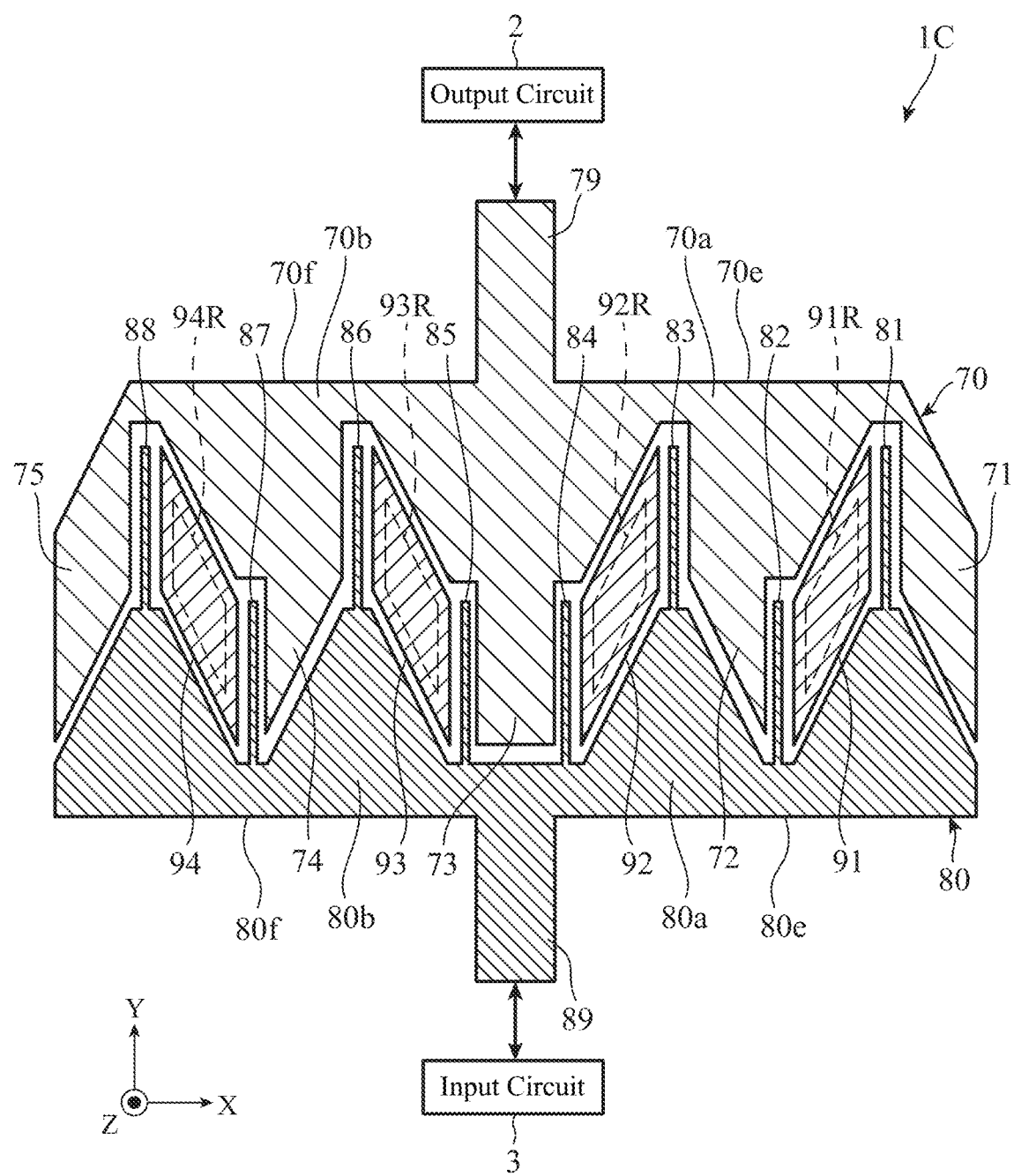
FIG. 8 is a plan view illustrating a layout of a semiconductor device having a multi-finger structure of a fourth embodiment according to the present invention.
Figure 9:
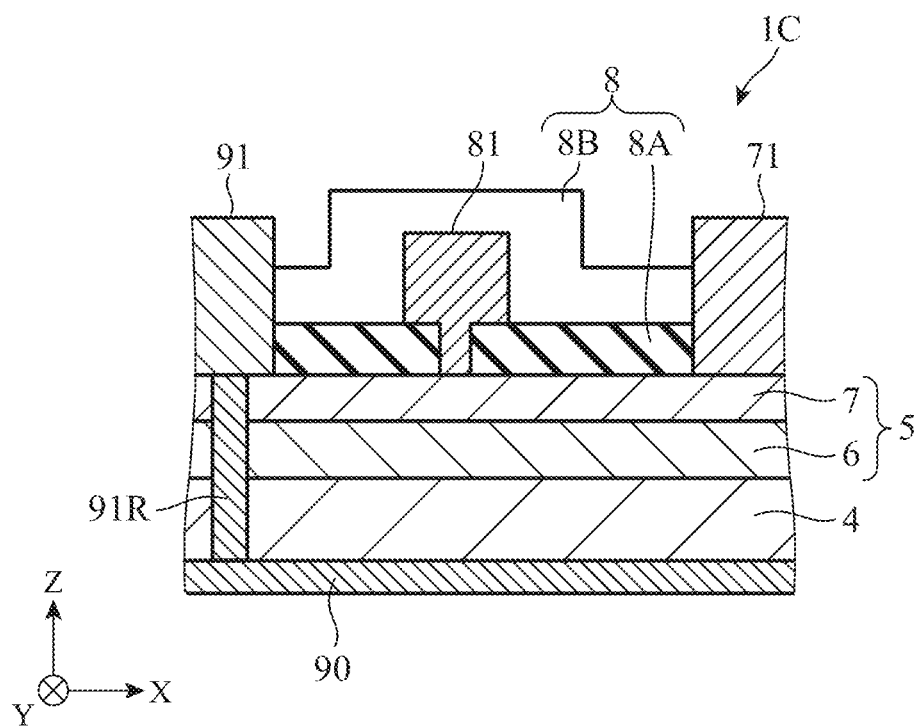
FIG. 9 is a schematic cross-sectional view of a unit transistor structure included as a part of the semiconductor device illustrated in FIG. 8.

FIG. 8 is a plan view illustrating a layout of a semiconductor device 1C having a multi-finger structure of the fourth embodiment according to the present invention. FIG. 9 is a schematic cross-sectional view of a unit transistor structure included as a part of the semiconductor device 1C illustrated in FIG. 8. In FIG. 9, a cross-section parallel to the X-Z plane including the X-axis and the Z-axis is illustrated.

As illustrated in FIG. 8, the semiconductor device 1C includes: a conductive pattern 70 including drain electrodes 71 to 75; source electrodes 91, 92, 93, and 94; via conductors 91R, 92R, 93R, and 94R provided on back surfaces of the source electrodes 91, 92, 93, and 94, respectively; and a conductive pattern 80 including gate fingers 81 to 88. The conductive patterns 70 and 80 and the source electrodes 91 to 94 are formed on a multilayer stack 5 illustrated in FIG. 9.

The conductive pattern 80 has a connection end 89 for signal input to be electrically connected to an input circuit 3 for transferring a high frequency signal, an interconnection portion 80a branching from the connection end 89 and extending in the X-axis positive direction, an interconnection portion 80b branching from the connection end 89 and extending in the X-axis negative direction, and a group of gate fingers 81 to 88 extending from the interconnection portions 80a and 80b in the Y-axis positive direction. Note that in the present embodiment the total number of the gate fingers 81 to 88 is eight, although no limitation to the total number is intended.

Each of the gate fingers 81 to 88 is a gate electrode having a linear finger shape extending in the Y-axis positive direction (an extending direction determined in advance). These gate fingers 81 to 88 have the same dimensions and are arranged at constant intervals (pitches) in the X-axis direction. The conductive pattern 80 can be formed by, for example, vapor deposition and dry etching using a metal material such as Ni or Au. Here, the interconnection portions 80a and 80b, the gate fingers 81 to 88, and the connection end 89 may be simultaneously formed in the same deposition process, or may be separately formed in different deposition processes. At least the gate fingers 81 to 88 are formed so as to form a Schottky barrier junction with the barrier layer 7 of FIG. 9.

Meanwhile, the conductive pattern 70 illustrated in FIG. 8 has a connection end 79 for signal output to be electrically connected to an output circuit 2 for transferring a high frequency signal, an interconnection portion 70a branching from the connection end 79 and extending in the X-axis positive direction, an interconnection portion 70b branching from the connection end 79 and extending in the X-axis negative direction, and drain electrodes 71, 72, 73, 74, and 75 extending from the interconnection portions 70a and 70b in the Y-axis negative direction. The source electrodes 91, 92, 93, 94, and 95 are provided at positions corresponding to the drain electrodes 71, 72, 73, 74, and 75, respectively. As illustrated in FIG. 8, the drain electrodes 71 to 75 and the source electrodes 91 to 95 are arranged so as to form electrode patterns in which the source electrodes and the drain electrodes are alternately arranged along the X-axis direction. Each of the eight gate fingers 81 to 88 is arranged in each of the regions between the source electrodes and the drain electrodes alternately arranged. Therefore, in the present embodiment, eight unit transistor structures are formed.

The conductive pattern 70 and the source electrodes 91 to 94 can be formed by, for example, vapor deposition and dry etching using a metal material such as Ti or Al. Here, the conductive pattern 70 and the source electrodes 91 to 94 may be simultaneously formed in the same deposition process, or may be separately formed in different deposition processes. At least the source electrodes 91 to 94 and the drain electrodes 71 to 75 are formed so as to form an ohmic junction with the barrier layer 7 in FIG. 9. Furthermore, the source electrodes 91, 92, 93, and 94 are electrically connected to via conductors 91R, 92R, 93R, and 94R for grounding, respectively, which pass through the multilayer stack 5 and underlying substrate 4 of FIG. 9 in the thickness direction of the underlying substrate 4 (Z-axis direction). The via conductors 91R, 92R, 93R, and 94R are connected to a backside interconnection layer 90 for grounding illustrated in FIG. 9 and are thereby grounded. Each of the via conductors 91R to 94R can be formed by, for example, forming a via hole that passes through from the back surface of the underlying substrate 4 to the top surface of the multilayer stack 5 by dry etching and then filling the via hole with a conductive material.

As illustrated in FIG. 8, the gate fingers 81 to 88 are arranged similarly to the gate fingers 31 to 38 of the first embodiment. That is, the gate fingers 81 to 88 are classified into two groups of the gate fingers 81, 83, 86, and 88 arranged at an upper position and the gate fingers 82, 84, 85, and 87 arranged at a lower position. The gate fingers 81, 83, 86, and 88 at the upper position are arranged in a row along the X-axis direction, and the other gate fingers 82, 84, 85, and 87 at the lower position are also arranged in a row along the X-axis direction. Here, a plurality of the gate fingers 81, 83, 86, and 88 arranged at the upper position and a plurality of the gate fingers 82, 84, 85, and 87 arranged at the lower position are arranged at their respective positions which are displaced from each other in the Y-axis direction (that is, the extending direction of the gate fingers 81 to 88). Moreover, the gate fingers 81 to 88 of the present embodiment are arranged at their respective positions alternating between the upper and lower positions in the Y-axis direction. In other words, the gate fingers 81 to 88 are arranged such that the positions of the gate fingers adjacent to each other via a source electrode or drain electrode are displaced from each other in the Y-axis direction.

The drain electrodes 71 to 75 and the source electrodes 91 to 94 have substantially parallelogram shapes to match the arrangement of the gate fingers 81 to 88. In addition, inner edges of the interconnection portions 80a and 80b have corrugated shapes which are curved shapes to match the arrangement of the gate fingers 81 to 88.

When the gate fingers 81 to 88 are arranged in the above manner, the length of the overlapping region between a plurality of the gate fingers 81, 83, 86, and 88 arranged at the upper position and a plurality of the gate fingers 82, 84, 85, and 87 arranged at the lower position as viewed from the X-axis direction becomes small. This allows for reduction in the spatial overlap between heat distributions generated in the gate fingers 81 to 88. Therefore, as compared with the conventional multi-finger structure, the multi-finger structure of the present embodiment is capable of suppressing an increase in the thermal resistance. Therefore, like in the case of the first embodiment, downsizing of the semiconductor device 1 can be easily implemented. In addition, it is possible to improve the thermal radiation characteristics without increasing the parasitic capacitance occurring due to the drain electrodes 71 to 75.

Furthermore, since the via conductors 91R to 94R for grounding are provided on the back surfaces of the source electrodes 91 to 94 in the present embodiment, the source electrodes 91 to 94 can be grounded without using the connecting conductors 20A to 20D and 50A to 50D of the first to third embodiments. Therefore, as compared with the first to third embodiments, further downsizing of the device size can be implemented. In addition, since no air bridge is used, the source inductance can be reduced. Furthermore as illustrated in FIG. 8, because the areas of the interconnection portions 70*a*, 70*b*, 80*a*, and 80*b* can be widened as compared to those of the first to third embodiments, it is possible to reduce the phase difference of a high frequency signal between the source electrodes and the drain electrodes. Therefore, the gain can be improved, and a structure more suitable for a high frequency band can be implemented.

It is understood that the semiconductor device 1C of the fourth embodiment can also be used in a power amplifier as an IM-FET or as a part of an MMIC.

Fifth Embodiment

Figure 10:
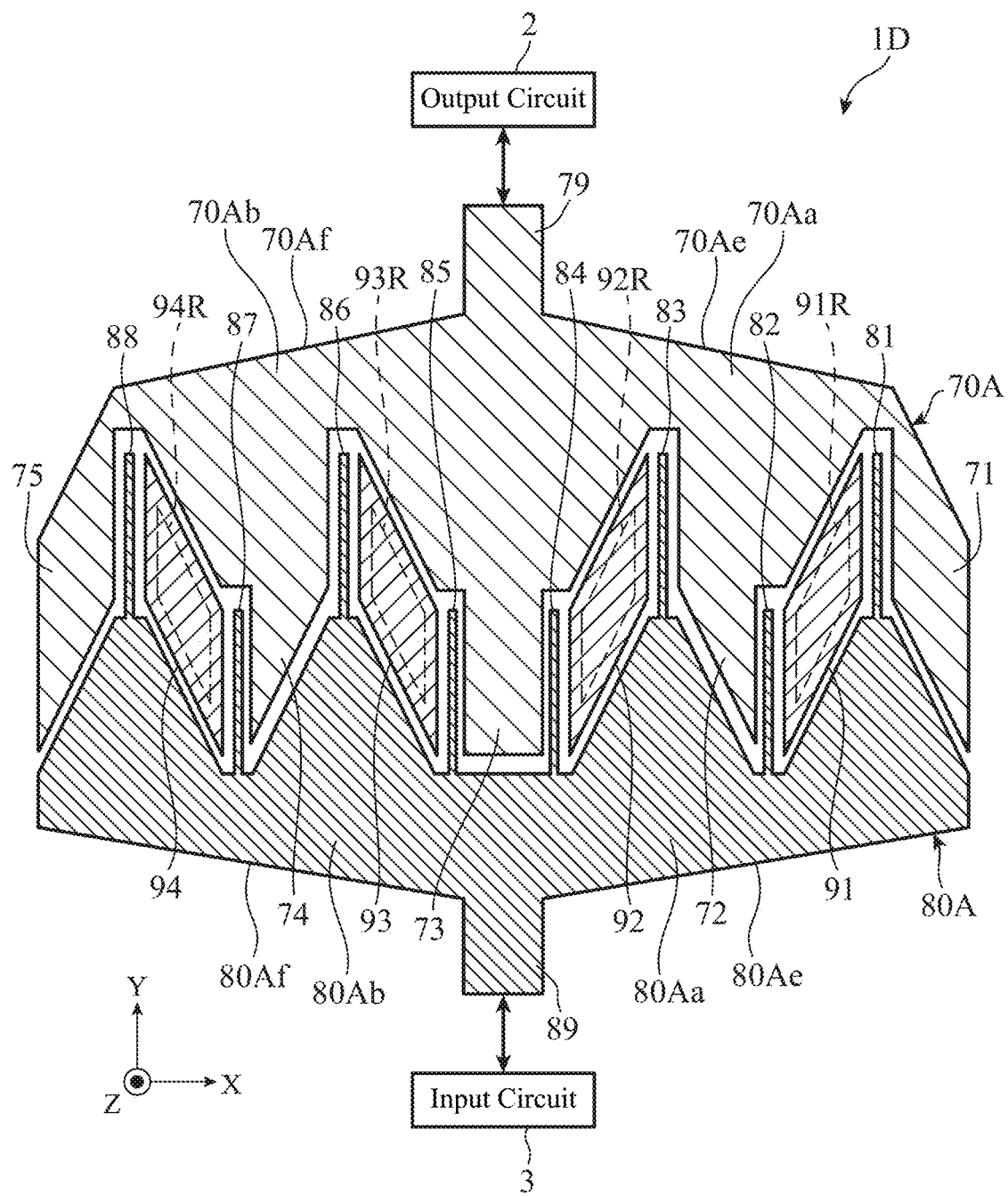
FIG. 10 is a plan view illustrating a layout of a semiconductor device of a fifth embodiment according to the present invention.

Next, a fifth embodiment which is a modification of the fourth embodiment will be described. FIG. 10 is a plan view illustrating a layout of a semiconductor device 1D of the fifth embodiment according to the present invention. A structure of the semiconductor device 1D of the present embodiment is the same as that of the semiconductor device 1C of the fourth embodiment except that conductive patterns 70A and 80A of FIG. 10 are included instead of the conductive patterns 70 and 80 described above.

In the fourth embodiment, outer edges 70*e* and 70*f* of the interconnection portions 70*a* and 70*b* of the conductive pattern 70 are not inclined with respect to the X-axis direction as illustrated in FIG. 8. Likewise, outer edges 80*e* and 80*f* of the interconnection portions 80*a* and 80*b* of the conductive pattern 80 are not inclined with respect to the X-axis direction. On the other hand, interconnection portions 70Aa and 70Ab of the conductive pattern 70A of the present embodiment have inclined shapes which are inclined with respect to the X-axis direction. Likewise, interconnection portions 80Aa and 80Ab of the conductive pattern 80A also have inclined shapes which are inclined with respect to the X-axis direction. A structure of the conductive patterns 70A and 80A according to the present embodiment is the same as that of the conductive patterns 70 and 80 of the fourth embodiment described above except for inclined shapes of outer edges 70Ae, 70Af, 80Ae, and 80Af.

As illustrated in FIG. 10, the shapes of the outer edges 70Ae and 70Af of the interconnection portions 70Aa and 70Ab are formed such that the width of the interconnection portions 70Aa and 70Ab in the X-axis direction increases as the position of the width moves from the connection end 79 toward the source electrodes 91 to 94. Similarly, the shapes of the outer edges 80Ae and 80Af of the interconnection portions 80Aa and 80Ab are formed such that the width of the interconnection portions 80Aa and 80Ab in the X-axis direction increases as the position of the width moves from a connection end 89 toward the source electrodes 91 to 94. By forming the outer edges 70Ae, 70Af, 80Ae, and 80Af in this manner, the phase difference of a high frequency signal between the source electrodes and the drain electrodes can be further reduced. Therefore, as compared to the fourth embodiment, the gain can be further improved, and a structure more suitable for a high frequency band can be implemented.

Although the various embodiments of the first to fifth embodiments according to the present invention have been described with reference to the drawings, these embodiments are examples of the present invention, and thus there can be various embodiments other than those embodiments. For example, the HEMT structure of the semiconductor devices 1 and 1A to 1D according to the first to fifth embodiments are all high-frequency devices using GaN, although no limitation thereto is intended.

Within the scope of the present invention, an arbitrary combination of the first to fifth embodiments, a modification of any component of the respective embodiments, or omission of any component in the respective embodiments is possible.

INDUSTRIAL APPLICABILITY

A semiconductor device according to the present invention may be used in a power amplifier operating in a high frequency band, and thus may be for use in, for example, a radar device, an antenna device, a microwave communication device, or a high-frequency measuring instrument.

REFERENCE SIGNS LIST

1, 1A to 1D: Semiconductor devices; 2: Output circuit; 3: Input circuit; 4: Underlying substrate; 5: Multilayer stack; 6: Channel layer; 7: Barrier layer; 8: Protective film; 10: Conductive pattern; 11 to 15: Drain electrodes; 19: Connection end; 20A to 20D: connecting conductors; 21 to 24: Source electrodes; 25 to 28: Air bridges; 29A to 29D: Via conductors; 30: Conductive pattern; 30*a*, 30*b*: Interconnection portions; 31 to 38: Gate fingers; 39: Connection end; 40: Conductive pattern; 41 to 45: Drain electrodes; 50A to 50D: Connecting conductors; 51 to 54: Source electrodes; 55 to 58, 55B, 56B, 57B, 58B: Air bridges; 59A to 59D: Via conductors; 60: Conductive pattern; 60*a*, 60*b*: Inclined interconnection portions; 61 to 68: Gate fingers; 70, 70A: Conductive patterns; 70*a*, 70*b*, 70Aa, 70Ab: Interconnection portions; 70*e*, 70*f*, 70Ae, 70Af: Outer edges; 71 to 75: Drain electrodes; 79: Connection end; 80, 80A: Conductive patterns; 80*a*, 80*b*, 80Aa, 80Ab: Interconnection portions; 80*e*, 80*f*, 80Ae, 80Af: Outer edges; 81 to 88: Gate fingers; 90: Backside interconnection layer; 91 to 94: Source electrodes; and 91R to 94R: Via conductors.

The invention claimed is:

1. A semiconductor device comprising:
   an underlying substrate having a first main surface and a second main surface which are opposed to each other;
   a semiconductor layer formed on the first main surface;
   electrode patterns in which a drain electrode and a source electrode are alternately arranged along at least one array direction determined in advance, on the semiconductor layer; and
   a group of gate fingers, each gate finger having a shape extending in an extending direction different from the at least one array direction on the semiconductor layer, and the each gate finger being disposed in a region between the drain electrode and the source electrode, wherein:

the group of gate fingers includes a plurality of gate fingers which are arranged at a first position and a second position which are different positions in the extending direction; and the plurality of gate fingers includes a plurality of first gate fingers arranged in a row along the at least one array direction at the first position, and at least one second gate finger disposed adjacent to at least one of the first gate fingers via the source electrode or the drain electrode, at the second position, the at least one second gate finger being disposed in a region allowing an overlapping region between the at least one second gate finger and the plurality of first gate fingers to vanish as viewed from the at least one array direction.

2. The semiconductor device according to claim 1, wherein the at least one second gate finger is comprised of two or more gate fingers arranged in a row along the at least one array direction.

3. A semiconductor device comprising:

an underlying substrate having a first main surface and a second main surface which are opposed to each other;

a semiconductor layer formed on the first main surface;

electrode patterns in which a drain electrode and a source electrode are alternately arranged along at least one array direction determined in advance, on the semiconductor layer; and a group of gate fingers, each gate finger having a shape extending in an extending direction different from the at least one array direction on the semiconductor layer, and the each gate finger being disposed in a region between the drain electrode and the source electrode, wherein:

the at least one array direction includes a first array direction inclined at an angle less than 90 degrees in a clockwise direction with respect to the extending direction; and the group of gate fingers includes a plurality of gate fingers arranged along the first array direction, the plurality of gate fingers being arranged at positions which are displaced from one another in the extending direction and allow overlapping regions among the plurality of gate fingers to vanish as viewed from a direction perpendicular to the extending direction.

4. The semiconductor device according to claim 3, wherein:

the at least one array direction is comprised of the first array direction and a second array direction inclined at an angle less than 90 degrees in a counterclockwise direction with respect to the extending direction; and the group of gate fingers further includes another plurality of gate fingers arranged along the second array direction, said another plurality of gate fingers is arranged at positions which are displaced from one another in the extending direction and allow overlapping regions among said another plurality of gate fingers to vanish as viewed from a direction perpendicular to the extending direction.

5. The semiconductor device according to claim 1, further comprising:

a first connecting conductor formed on the semiconductor layer and electrically connected to one end of the source electrode in the extending direction;

a first via conductor for grounding, configured to pass through both the semiconductor layer and the underlying substrate in a thickness direction of the underlying substrate, and electrically connected to the first connecting conductor;

a second connecting conductor formed on the semiconductor layer and electrically connected to another end of the source electrode in the extending direction; and a second via conductor for grounding, configured to pass through both the semiconductor layer ad the underlying substrate in the thickness direction, and electrically connected to the second connecting conductor.

6. The semiconductor device according to claim 5, further comprising:

a first air bridge electrically connecting the end of the source electrode to the first connecting conductor; and a second air bridge electrically connecting said another end of the source electrode to the second connecting conductor.

7. The semiconductor device according to claim 1, further comprising:

a backside interconnection layer formed on the second main surface of the underlying substrate; and a via conductor for grounding, configured to pass through both the underlying substrate and the semiconductor layer in a thickness direction of the underlying substrate and electrically connecting the source electrode to the backside interconnection layer.

8. The semiconductor device according to claim 7, further comprising:

a first connection end for signal input;

a second connection end for signal output;

a first interconnection portion making an electrical connection between the first connection end and the group of gate fingers; and a second interconnection portion making an electrical connection between the second connection end and the drain electrode, wherein an outer edge of the first interconnection portion has an inclined shape in which a width of the first interconnection portion in the at least one array direction increases as a position of the width of the first interconnection portion moves from the first connection end toward the source electrode, and an outer edge of the second interconnection portion ha an inclined shape in which a width of the second interconnection portion in the at least one array direction increases as a position of the width of the second interconnection portion moves from the second connection end toward the source electrode.

9. The semiconductor device according to claim 1, wherein the group of gate fingers is arranged at constant intervals in the at least one array direction.

10. The semiconductor device according to claim 1, wherein the semiconductor layer is a multilayer stack in which compound semiconductor layers are stacked, each compound semiconductor layer containing a group III nitride semiconductor.

11. The semiconductor device according to claim 10, wherein the compound semiconductor layers include a channel layer in which two-dimensional electron gas is formed, and a barrier layer forming heterojunction with the channel layer on the channel layer.

12. The semiconductor device according to claim 3, further comprising:

a first connecting conductor fanned on the semiconductor layer and electrically connected to one end of the source electrode in the extending direction;

a first via conductor for grounding, configured to pass through both the semiconductor layer and the underlying substrate in a thickness direction of the underlying substrate, and electrically connected to the first connecting conductor;

a second connecting conductor formed on the semiconductor layer and electrically connected to another end of the source electrode in the extending direction; and a second via conductor for grounding, configured to pass through both the semiconductor layer and the underlying substrate in the thickness direction, and electrically connected to the second connecting conductor.

13. The semiconductor device according to claim 12, further comprising:

a first air bridge electrically connecting the end of the source electrode to the first connecting conductor; and a second air bridge electrically connecting said another end of the source electrode to the second connecting conductor.

14. The semiconductor device according to claim 3, further comprising:

a backside interconnection layer formed on the second main surface of the underlying substrate; and a via conductor for grounding, configured to pass through both the underlying substrate and the semiconductor layer in a thickness direction of the underlying substrate and electrically connecting the source electrode to the backside interconnection layer.

15. The semiconductor device according to claim 14, further comprising:

a first connection end for signal input;

a second connection end for signal output;

a first interconnection portion making an electrical connection between the first connection end and the group of gate fingers; and a second interconnection portion making an electrical connection between the second connection end and the drain electrode, wherein an outer edge of the first interconnection portion has an inclined shape in which a width of the first interconnection portion in the at least one array direction increases as a position of the width of the first interconnection portion moves from the first connection end toward the source electrode, and an outer edge of the second interconnection portion has an inclined shape in which a width of the second interconnection portion in the at least one array direction increases as a position of the width of the second interconnection portion moves from the second connection end toward the source electrode.

16. The semiconductor device according to claim 3, wherein the group of gate fingers is arranged at constant intervals in the at least one array direction.

17. The semiconductor device according to claim 3, wherein the semiconductor layer is a multilayer stack in which compound semiconductor layers are stacked, each compound semiconductor layer containing a group III nitride semiconductor.

18. The semiconductor device according to claim 17, wherein the compound semiconductor layers include a channel layer in which two-dimensional electron gas is formed, and a barrier layer forming heterojunction with the channel layer on the channel layer.

* * * * *